(12) United States Patent
Park

(10) Patent No.: US 12,339,311 B2
(45) Date of Patent: Jun. 24, 2025

(54) METHOD OF IDENTIFYING APPLIANCES BY ANALYZING HARMONIC COMPONENTS OF POWER SIGNAL AND DEVICES FOR PERFORMING THE SAME

(71) Applicant: Electronics and Telecommunications Research Institute, Daejeon (KR)

(72) Inventor: Dae Geun Park, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 314 days.

(21) Appl. No.: 17/736,521

(22) Filed: May 4, 2022

(65) Prior Publication Data

US 2022/0365127 A1 Nov. 17, 2022

(30) Foreign Application Priority Data

May 4, 2021 (KR) .................. 10-2021-0058070

(51) Int. Cl.
*G01R 31/28* (2006.01)
*G01R 19/25* (2006.01)

(52) U.S. Cl.
CPC ..... *G01R 31/2825* (2013.01); *G01R 19/2513* (2013.01)

(58) Field of Classification Search
CPC .............. G01R 21/133; G01R 19/2513; G01R 21/06; G01R 31/2825; G01R 23/16;
(Continued)

(56) References Cited

U.S. PATENT DOCUMENTS

| 2014/0214729 | A1* | 7/2014 | Lin ..................... H04L 69/04 |
| | | | 705/412 |
| 2014/0257532 | A1 | 9/2014 | Kim et al. |
| 2014/0336831 | A1 | 11/2014 | Seo et al. |
| 2015/0312230 | A1 | 10/2015 | Choi et al. |
| 2020/0057098 | A1* | 2/2020 | Rizzo ................. G05D 23/1917 |

FOREIGN PATENT DOCUMENTS

| JP | 2011-76253 | 4/2011 |
| JP | 2013-518556 | 5/2013 |

(Continued)

OTHER PUBLICATIONS

Bacurau, Rodrigo, et al. "Experimental investigation on the load signature parameters for non-intrusive load monitoring." Przeglad Elektrotechniczny 91.8 (2015): 86-90. (Year: 2015).*

(Continued)

*Primary Examiner* — Yoshihisa Ishizuka
*Assistant Examiner* — Carter W Ferrell
(74) *Attorney, Agent, or Firm* — KILE PARK REED & HOUTTEMAN PLLC

(57) ABSTRACT

Provided are a method and device for identifying an individual appliance through analysis of a harmonic component of a power signal. An operating appliance identification method includes collecting a mixed load signal from a home power distribution network, generating a first candidate appliance list by selecting first candidate appliances among individual appliances registered in an individual appliance harmonic analysis information table based on a ratio of a harmonic component value included in the mixed load signal, generating a second candidate appliance list including second candidate appliances by filtering the first candidate appliances based on a magnitude of the harmonic component value included in the mixed load signal, and identifying an operating appliance among a plurality of appliances connected to the home power distribution network by using the second candidate appliance list.

18 Claims, 10 Drawing Sheets

(58) Field of Classification Search
CPC .............. G01R 31/2837; G01R 23/005; Y04S 20/30; Y04S 20/242; G06Q 50/06; G01D 2204/24; Y02B 90/20; H02J 2310/70; H02J 2310/14
See application file for complete search history.

(56) References Cited

FOREIGN PATENT DOCUMENTS

| KR | 10-2013-0056036 | 5/2013 |
|---|---|---|
| KR | 10-1714698 | 3/2017 |
| KR | 10-2017-0087199 | 7/2017 |
| KR | 10-2018-0058113 | 5/2018 |
| KR | 10-2019-0070147 | 6/2019 |
| KR | 10-2019-0084079 | 7/2019 |
| KR | 10-2012933 | 8/2019 |
| WO | 2020/043737 | 3/2020 |

OTHER PUBLICATIONS

Cole, Agnim, and Alexander Albicki. "Nonintrusive identification of electrical loads in a three-phase environment based on harmonic content." Proceedings of the 17th IEEE Instrumentation and Measurement Technology Conference [Cat. No. 00CH37066]. vol. 1. IEEE, 2000. (Year: 2000).*

Liang, Jian, et al. "Load signature studyâPart I: Basic concept, structure, and methodology." IEEE transactions on power Delivery 25.2 (2009): 551-560. (Year: 2009).*

Meehan, Paula, Conor McArdle, and Stephen Daniels. "An efficient, scalable time-frequency method for tracking energy usage of domestic appliances using a two-step classification algorithm." Energies 7.11 (2014): 7041-7066. (Year: 2014).*

Semwal, Sunil, R. S. Prasad, and Pradeep Juneja. "Identifying appliances using NIALM with minimum features." International Journal of Electrical and Computer Engineering (IJECE) 4.6 (2014): 909-922. (Year: 2014).*

Salles, Diogo, et al. "Assessing the collective harmonic impact of modern residential loads—Part I: Methodology." IEEE transactions on power delivery 27.4 (2012): 1937-1946. (Year: 2012).*

Aggelos S. Bouhouras et al., "Load Signature Formulation for Non-Intrusive Load Monitoring Based on Current Measurements", Energies, 2017, 22 total pages.

Jian Liang et al., "Load Signature Study—Part I: Basic Concept, Structure, and Methodology", IEEE Transactions on Power Delivery, Apr. 2010, vol. 25, No. 2, pp. 551-560.

* cited by examiner

| Division | Individual appliance and 1st to 11th-order harmonic components of mixed load signal ||||||||| |
| --- | --- | --- | --- | --- | --- | --- | --- | --- | --- |
| | (1)Microwave oven | (2)Toaster | (3)Electric pot | (4)Dryer | (5)Kimchi refrigerator | (6)Fan | (7)LED light | (8)Laptop computer | Mixed load |
| H1 | 0.08087 | 0.07046 | 0.04708 | 0.08021 | 0.01277 | 0.01868 | 0.01502 | 0.02765 | 0.18743 |
| H3 | 0.02161 | 0.00249 | 0.00169 | 0.00409 | 0.00139 | 0.00020 | 0.01276 | 0.02431 | 0.01278 |
| H5 | 0.01012 | 0.00219 | 0.00143 | 0.00225 | 0.00067 | 0.00146 | 0.00966 | 0.01912 | 0.00818 |
| H7 | 0.00482 | 0.00075 | 0.00050 | 0.00030 | 0.00028 | 0.00019 | 0.00705 | 0.01334 | 0.00479 |
| H9 | 0.00243 | 0.00115 | 0.00074 | 0.00090 | 0.00022 | 0.00024 | 0.00586 | 0.00941 | 0.00371 |
| H11 | 0.00148 | 0.00017 | 0.00009 | 0.00014 | 0.00008 | 0.00027 | 0.00542 | 0.00820 | 0.00092 |

FIG. 7A

| Division | Individual appliance and ratio between adjacent harmonic components of mixed load signal ||||||||| |
| --- | --- | --- | --- | --- | --- | --- | --- | --- | --- |
| | (1)Microwave oven | (2)Toaster | (3)Electric pot | (4)Dryer | (5)Kimchi refrigerator | (6)Fan | (7)LED light | (8)Laptop computer | Mixed load |
| H3/H1 | 0.26718 | 0.03539 | 0.03593 | 0.05100 | 0.10871 | 0.01073 | 0.84955 | 0.87923 | 0.06819 |
| H5/H3 | 0.46831 | 0.87644 | 0.84581 | 0.54919 | 0.47953 | 7.26319 | 0.75719 | 0.78666 | 0.64023 |
| H7/H5 | 0.47661 | 0.34261 | 0.35000 | 0.13463 | 0.42491 | 0.12915 | 0.72931 | 0.69733 | 0.58546 |
| H9/H7 | 0.50417 | 1.53179 | 1.47039 | 2.96825 | 0.76657 | 1.27805 | 0.83172 | 0.70582 | 0.77450 |
| H11/H9 | 0.60816 | 0.14749 | 0.12206 | 0.16079 | 0.36343 | 1.12669 | 0.92414 | 0.87108 | 0.24912 |

FIG. 7B

| Division | Individual appliance and ratio between adjacent harmonic components of mixed load signal ||||||||| |
| --- | --- | --- | --- | --- | --- | --- | --- | --- | --- |
| | (1)Microwave oven | (2)Toaster | (3)Electric pot | (4)Dryer | (5)Kimchi refrigerator | (6)Fan | (7)LED light | (8)Laptop computer | Mixed load |
| H3/H1 | 1.19899 | -0.03281 | -0.03226 | -0.01720 | 0.04051 | -0.05746 | 0.78136 | 0.81104 | 0.00000 |
| H5/H3 | -0.17192 | 0.23621 | 0.20558 | -0.09104 | -0.16070 | 6.62296 | 0.11696 | 0.14643 | 0.00000 |
| H7/H5 | -0.10885 | -0.24285 | -0.23546 | -0.45083 | -0.16055 | -0.45631 | 0.14385 | 0.11187 | 0.00000 |
| H9/H7 | -0.27032 | 0.75729 | 0.69589 | 2.19375 | -0.00793 | 0.50355 | 0.05722 | -0.06867 | 0.00000 |
| H11/H9 | 0.35903 | -0.10163 | -0.12706 | -0.08833 | 0.11431 | 0.87757 | 0.67502 | 0.62196 | 0.00000 |
| 오차합 | 0.00693 | 0.61622 | 0.50668 | 1.54635 | -0.17436 | 7.49031 | 1.77441 | 1.62262 | 0.00000 |

FIG. 7C

| Division | Individual appliance and ratio between adjacent harmonic components of mixed load signal | | | | |
|---|---|---|---|---|---|
| | (1)Microwave oven | (2)Toaster | (3)Electric pot | (5)Kimchi refrigerator | Mixed load |
| H1 | 0.08087 | 0.07046 | 0.04708 | 0.01277 | 0.18743 |
| $H_1^M < H_1^{obs}$ | O | O | O | O | |

FIG. 7D

| Appliance group | H1 individual sum | Individual H1/Mixed H1 |
|---|---|---|
| 1 | 0.08087 | 0.43149 |
| 2 | 0.07046 | 0.37591 |
| 3 | 0.04708 | 0.25118 |
| 5 | 0.01277 | 0.06813 |
| 1,2 | 0.1513 | 0.80739 |
| 1,3 | 0.1280 | 0.68267 |
| 1,5 | 0.0936 | 0.49962 |
| 2,3 | 0.1175 | 0.62708 |
| 2,5 | 0.0832 | 0.44404 |
| 3,5 | 0.0598 | 0.31931 |
| 1,2,3 | 0.19841 | 1.05857 |
| 1,2,5 | 0.1641 | 0.87552 |
| 1,3,5 | 0.1407 | 0.75080 |
| 2,3,5 | 0.13030 | 0.69521 |
| 1,2,3,5 | 0.21118 | 1.12670 |

FIG. 7E

METHOD OF IDENTIFYING APPLIANCES BY ANALYZING HARMONIC COMPONENTS OF POWER SIGNAL AND DEVICES FOR PERFORMING THE SAME

CROSS-REFERENCE TO RELATED APPLICATION

This application claims the benefit of Korean Patent Application No. 10-2021-0058070 filed on May 4, 2021, in the Korean Intellectual Property Office, the entire disclosure of which is incorporated herein by reference for all purposes.

BACKGROUND

1. Field of the Invention

One or more example embodiments relates to a method of identifying individual appliances by analyzing harmonic components of a power signal and devices for performing the same.

2. Description of the Related Art

A non-intrusive load monitoring (NILM) technology is a technology for identifying the type of home appliance is use by analyzing a power signal measured at a point of a home power distribution network.

The NILM technology is divided into a low-speed sampling method and a high-speed sampling method according to a signal collection period. The low-speed sampling method usually collects signals at a sampling rate lower than 1 Hz, and the high-speed sampling method collects signals at a sampling rate of 1 Hz to several MHz.

The NILM technology based on low-speed sampling allows the use of existing power meters for signal collection. The NILM technology based on low-speed sampling does not require a separate device. In the case of using the NILM technology based on the low-speed sampling, when appliances with similar power consumption exist, it is difficult to identify the operating appliances.

The NILM technology based on the high speed sampling may identify the appliances operating in the power distribution network by extracting specific signals that allows each appliance to be identified from the collected signal. Separate hardware and signal processing functions are required for the NILM technology based on the high speed sampling.

The appliance identification technology is premised on the assumption that the appliance may be described with information related to operation of the appliance or information related to electrical properties of the appliance.

The above-mentioned background art is possessed or acquired by the inventors in the process of deriving the disclosure of the present application, and is not necessarily a known art disclosed to the general public prior to the present application.

SUMMARY

Example embodiments provide a technology for identifying individual appliances based on analysis of harmonic components of a power signal even in the presence of noise or similar harmonic components.

However, technical goals are not limited to the above-described technical goals, and other technical goals may exist.

According to an aspect, there is provided an operating appliance identification method including collecting a mixed load signal from a home power distribution network, generating a first candidate appliance list by selecting first candidate appliances among individual appliances registered in an individual appliance harmonic analysis information table based on a ratio of a harmonic component value included in the mixed load signal, generating a second candidate appliance list including second candidate appliances by filtering the first candidate appliances based on a magnitude of the harmonic component value included in the mixed load signal, and identifying an operating appliance among a plurality of appliances connected to the home power distribution network by using the second candidate appliance list.

The operating appliance identification method may further include generating the individual appliance harmonic analysis information table.

The generating of the individual appliance harmonic analysis information table may include selecting an individual appliance connected to a power distribution network, extracting a harmonic component value included in an individual appliance signal generated when the selected individual appliance operates, calculating a ratio of the harmonic component value based on the harmonic component value, and storing the ratio of the harmonic component value included in the individual appliance signal.

The ratio of the harmonic component value included in the individual appliance signal may be a ratio of adjacent harmonic component values or a ratio of a first-order harmonic component value and an (N+1)th-order harmonic component value, and the N may be an integer of 1 or more.

The ratio of the harmonic component value included in the mixed load signal may be a ratio of adjacent harmonic component values or a ratio of a first-order harmonic component value and an (N+1)th-order harmonic component value, and the N may be an integer of 1 or more.

The generating of the first candidate appliance list may include extracting the harmonic component value included in the mixed load signal and calculating the ratio of the harmonic component value based on a plurality of harmonic component values.

The generating of the first candidate appliance list may include selecting an appliance from the individual appliance harmonic component analysis table, calculating an error between a ratio of a harmonic component value included in an individual appliance signal of the selected appliance and the ratio of the harmonic component value included in the mixed load signal for each order, summing up the errors obtained for each order, and including the selected appliance in the first candidate appliance list based on the sum of the errors.

The generating of the second candidate appliance list may include selecting a candidate appliance from the first candidate appliance list, and including the selected candidate appliance in the second candidate appliance list by comparing a magnitude of a first-order harmonic component value included in an individual appliance signal of the selected candidate appliance with a magnitude of a first-order harmonic component value included in the mixed load signal.

The identifying of the operating appliance may include generating appliance combinations capable of being made with appliances in the second candidate appliance list, selecting one of the appliance combinations, calculating a sum of magnitudes of first-order harmonic component values included in individual appliance signals of appliances in the selected appliance combination, and calculating a ratio of the sum of the magnitudes of the first-order harmonic component values included in the individual appliance signals and a magnitude of the first-order harmonic value of the mixed load signal.

The identifying of the operating appliance may further include, when the ratio of the magnitudes of the first-order harmonic component values is within a predetermined threshold range, recording the appliance combination and the ratio of the magnitudes of the first-order harmonic component values in a candidate appliance combination list, selecting, among appliance combinations included in the candidate appliance combination list, an appliance combination in which a value obtained by subtracting 1 from the ratio of the magnitudes of the first-order harmonic component values is closest to 0, and determining appliances included in the selected appliance combination as operating appliances.

According to another aspect, there is provided an operating appliance identification device including a memory configured to store one or more instructions, and a processor configured to execute the one or more instructions, wherein, when the one or more instructions are executed, the processor is configured to collect a mixed load signal from a home power distribution network, generate a first candidate appliance list by selecting first candidate appliances among individual appliances registered in an individual appliance harmonic analysis information table based on a ratio of a harmonic component value included in the mixed load signal, generate a second candidate appliance list including second candidate appliances by filtering the first candidate appliances based on a magnitude of the harmonic component value included in the mixed load signal, and identify an operating appliance among a plurality of appliances connected to the home power distribution network by using the second candidate appliance list.

The processor may be configured to generate the individual appliance harmonic analysis information table.

The processor may be configured to select an appliance connected to a power distribution network, extract a harmonic component value included in an individual appliance signal generated when the selected appliance operates, calculate a ratio of the harmonic component value based on a plurality of harmonic component values, and store the ratio of the harmonic component value of the selected appliance.

The ratio of the harmonic component value included in the individual appliance signal may be a ratio of adjacent harmonic component values or a ratio of a first-order harmonic component value and an (N+1)th-order harmonic component value, and the N may be an integer of 1 or more.

The ratio of the harmonic component value included in the mixed load signal may be a ratio of adjacent harmonic component values or a ratio of a first-order harmonic component value and an (N+1)th-order harmonic component value, and the N may be an integer of 1 or more.

The processor may be configured to extract the harmonic component value included in the mixed load signal, and calculate the ratio of the harmonic component value based on a plurality of harmonic component values.

The processor may be configured to select an appliance from the individual appliance harmonic component analysis table, calculate an error of a ratio of a harmonic component value included in an individual appliance signal of the selected appliance and the ratio of the harmonic component value included in the mixed load signal for each order, sum up the errors obtained for each order, and include the selected appliance in the first candidate appliance list based on the sum of the errors.

The processor may be configured to select a candidate appliance from the first candidate appliance list, and include the selected candidate appliance in the second candidate appliance list by comparing a magnitude of a first-order harmonic component value included in an individual appliance signal of the selected candidate appliance with a magnitude of a first-order harmonic component value included in the mixed load signal.

According to still another aspect, there is provided an operating appliance identification system including a plurality of appliances connected to a home power distribution network and an operating appliance identification device configured to identify an operating appliance among the plurality of appliances, wherein the operating appliance identification device is configured to generate a first candidate appliance list by selecting first candidate appliances among individual appliances registered in an individual appliance harmonic analysis information table based on a ratio of a harmonic component value included in a mixed load signal, generate a second candidate appliance list including second candidate appliances by filtering the first candidate appliances based on a magnitude of the harmonic component value of the mixed load signal, and identify an operating appliance among the plurality of appliances by using the second candidate appliance list.

Additional aspects of example embodiments will be set forth in part in the description which follows and, in part, will be apparent from the description, or may be learned by practice of the disclosure.

BRIEF DESCRIPTION OF THE DRAWINGS

These and/or other aspects, features, and advantages of the invention will become apparent and more readily appreciated from the following description of example embodiments, taken in conjunction with the accompanying drawings of which:

FIGS. 7A to 7E illustrate examples of performing an operating appliance identification method by an operating appliance identification device.

DETAILED DESCRIPTION

Figure 1:
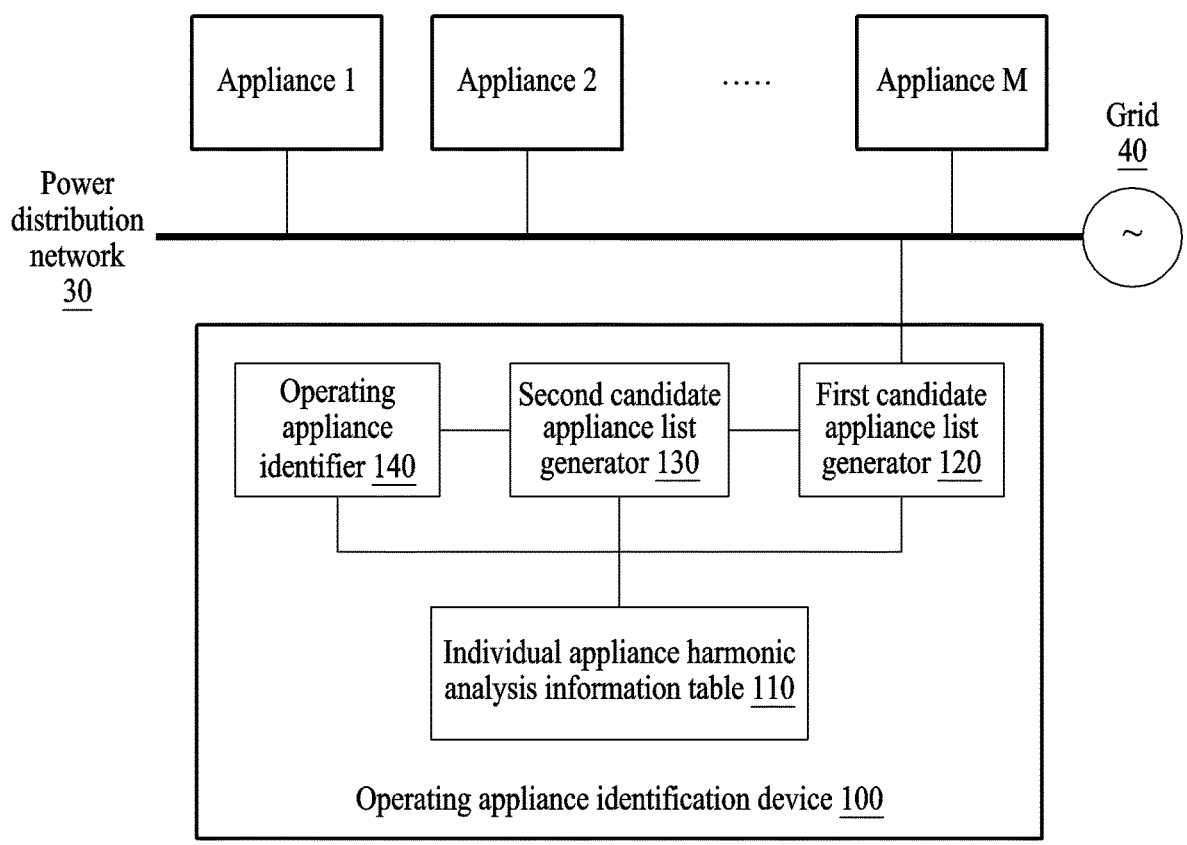
FIG. 1 is a schematic block diagram illustrating an operating appliance identification system according to an example embodiment.

The following structural or functional descriptions of example embodiments described herein are merely intended for the purpose of describing the example embodiments described herein and may be implemented in various forms. Various modifications may be made to the example embodiments. Here, the example embodiments are not construed as limited to the disclosure and should be understood to include all changes, equivalents, and replacements within the idea and the technical scope of the disclosure.

Although terms of "first," "second," and the like are used to explain various components, the components are not limited to such terms. These terms are used only to distinguish one component from another component. For example, a first component may be referred to as a second component, or similarly, the second component may be referred to as the first component within the scope of the present disclosure.

When it is mentioned that one component is "connected" or "accessed" to another component, it may be understood that the one component is directly connected or accessed to another component or that still other component is interposed between the two components.

As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, components or a combination thereof, but do not preclude the presence or addition of one or more other features, integers, steps, operations, elements, components, and/or groups thereof.

Unless otherwise defined herein, all terms used herein including technical or scientific terms have the same meanings as those generally understood by one of ordinary skill in the art. Terms defined in dictionaries generally used should be construed to have meanings matching contextual meanings in the related art and are not to be construed as an ideal or excessively formal meaning unless otherwise defined herein.

Hereinafter, example embodiments will be described in detail with reference to the accompanying drawings. When describing the example embodiments with reference to the accompanying drawings, like reference numerals refer to like components and a repeated description related thereto will be omitted.

Figure 2:
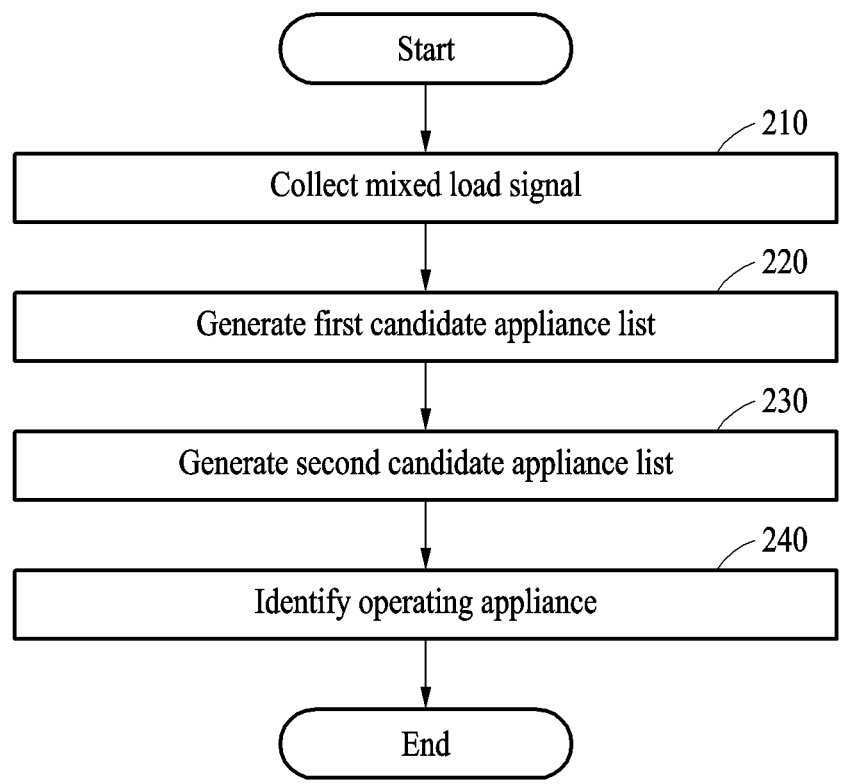
FIG. 2 is a flowchart illustrating an example of an operation method of an operating appliance identification device shown in FIG. 1.

FIG. 1 illustrates a schematic block diagram of an operating appliance identification system according to an example embodiment, and FIG. 2 is a flowchart for illustrating an example of an operation method of an operating appliance identification device shown in FIG. 1.

Referring to FIG. 1 and FIG. 2, an operating appliance identification system 10 may include an operating appliance identification device 100, a plurality of appliances (e.g., appliance 1 to appliance M), and a power distribution network 30. The power distribution network 30 may be connected to a grid 40.

The operating appliance identification device 100 may collect a mixed load signal related to the plurality of appliances (appliance 1 to appliance M) connected to the power distribution network 30, and identify an operating appliance based on a ratio of a harmonic component value included in the mixed load signal. M (e.g., M is a natural number) appliances 200 may be connected to the power distribution network 30 and operate. The power distribution network 30 may be a home power distribution network, and the power distribution network 30 may receive power from the grid 40. The gird 40 may be a power grid. The operating appliance identification device 100 may be connected to a point between the grid 40 and the power distribution network 30. The operating appliance identification device 100 may include an individual appliance harmonic analysis information table 110, a first candidate appliance list generator 120, a second candidate appliance list generator 130, and an operating appliance identifier 140.

In operation 210, the first candidate appliance list generator 120 may collect a mixed load signal from the power distribution network 30.

In operation 220, the first candidate appliance list generator 120 may select first candidate appliances among individual appliances in the individual appliance harmonic analysis information table 110 based on the ratio of the harmonic component value included in the mixed load signal. The first candidate appliance list generator 120 may generate a first candidate appliance list including the first candidate appliances.

For example, the harmonic component value included in an individual appliance signal generated when each appliance 200 connected to the power distribution network 30 operates and a ratio of the harmonic component value are stored in the individual appliance harmonic analysis information table 110. The operating appliance identification device 100 may generate the individual appliance harmonic analysis information table 110 in advance. In operation 230, the second candidate appliance list generator 130 may select second candidate appliances among the appliances in the first candidate appliance list based on the magnitude of the harmonic component value included in the mixed load signal. The second candidate appliance list generator 130 may generate a second candidate appliance list including the second candidate appliances.

In operation 240, the operating appliance identifier 140 may identify the operating appliance among the appliances in the second candidate appliance list based on the magnitude of the harmonic component value included in the mixed load signal.

Hereinafter, with reference to FIGS. 3 to 6, the operation method of the operating appliance identification device of FIG. 2 will be described in detail.

Figure 3:
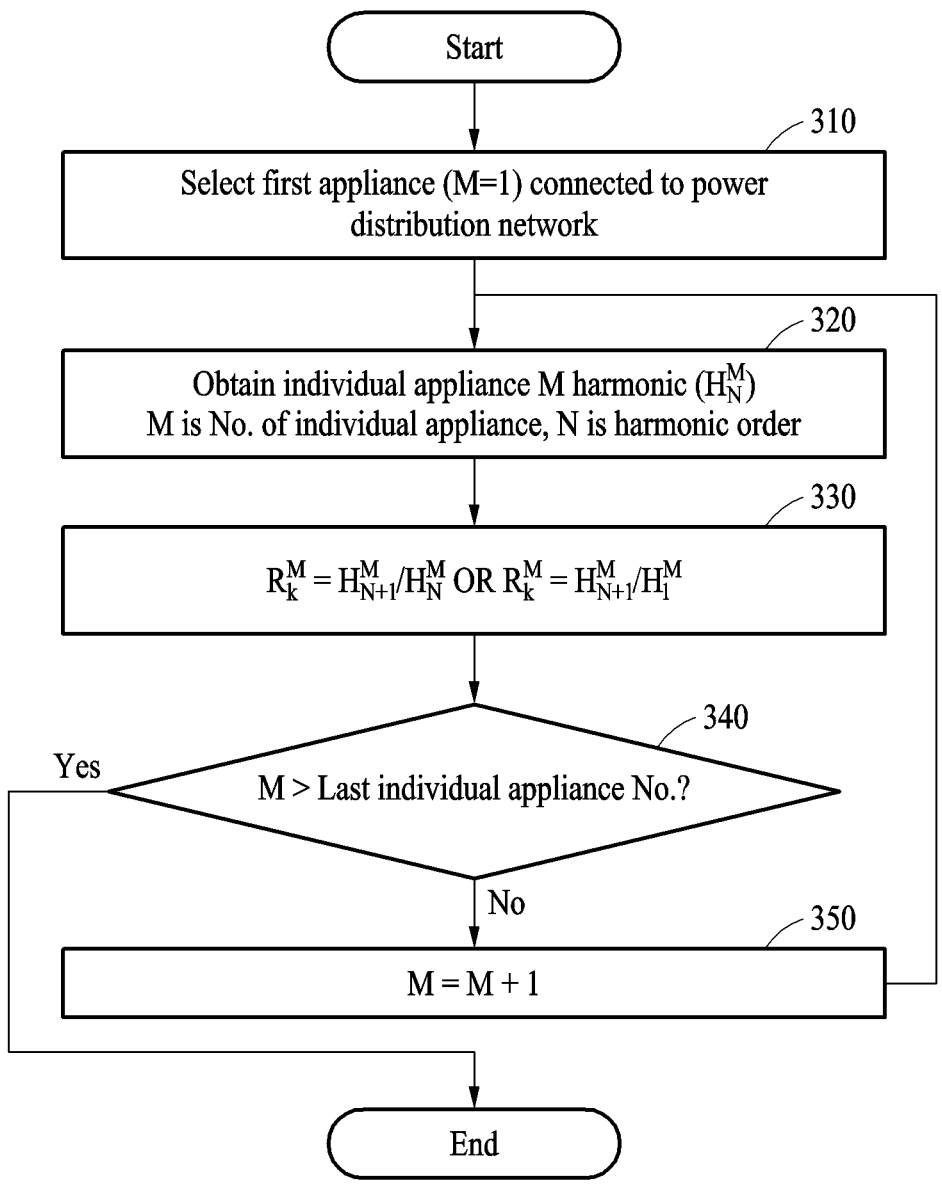
FIG. 3 is an example of a flow chart illustrating an example of an operation of generating a harmonic analysis information table by an operating appliance identification device.

FIG. 3 is an example of a flow chart for illustrating an example of an operation of generating a harmonic analysis information table by the operating appliance identification device.

The operating appliance identification device 100 may generate (e.g., record) the individual appliance harmonic analysis information table 110. The operating appliance identification device 100 may store the recorded individual appliance harmonic analysis information table 110 in a memory (e.g., a memory 810 in FIG. 8).

In operation 310, the operating appliance identification device 100 may select one of the appliances (appliance 1 to appliance M) connected to the power distribution network 30.

In operation 320, the operating appliance identification device 100 may extract the harmonic component value through signal processing (e.g., fast fourier transform (FFT)) of the Nth-order (e.g., N is an integer of 1 or more, odd, or even) harmonic component included in the individual appliance signal.

In operation 330, the operating appliance identification device 100 may calculate the ratio ($R_k^M$) of the harmonic component value included in the individual appliance signal by using the extracted harmonic component value ($H_N^M$) (e.g., M is an individual appliance sequence number, N is a harmonic order), and store the ratio ($R_k^M$) of the harmonic component value in the individual appliance analysis information table 110.

The ratio ($R_k^M$) of the harmonic component value included in the individual appliance signal may be a ratio of adjacent harmonic component values ($H_{N+1}^M/H_N^M$), or a ratio ($H_{N+1}^M/H_1^M$) of a first-order harmonic component value and an (N+1)th-order (e.g., N is an integer of 1 or more, odd, or even) harmonic component value. The ratio ($R_k^M$) of the harmonic component value included in the individual appliance signal may be calculated using Equation (1).

$$R_k^M = H_{N+1}^M/H_N^M \text{ OR } R_k^M = H_{N+1}^M/H_1^M \qquad \text{[Equation 1]}$$

In operation 340, the operating appliance identification device 100 may select another one of the appliances 200 connected to the power distribution network 30.

In operation 350, the operating appliance identification device 100 may finish the operation when there is no other appliance to select among the appliances (appliance 1 to appliance M) connected to the power distribution network 30. When there is another appliance to select among the appliances 200 connected to the power distribution network 30, the processor 600 may generate the individual appliance analysis information table 110 by repeating the above-described operation 310 to operation 340.

Figure 8:
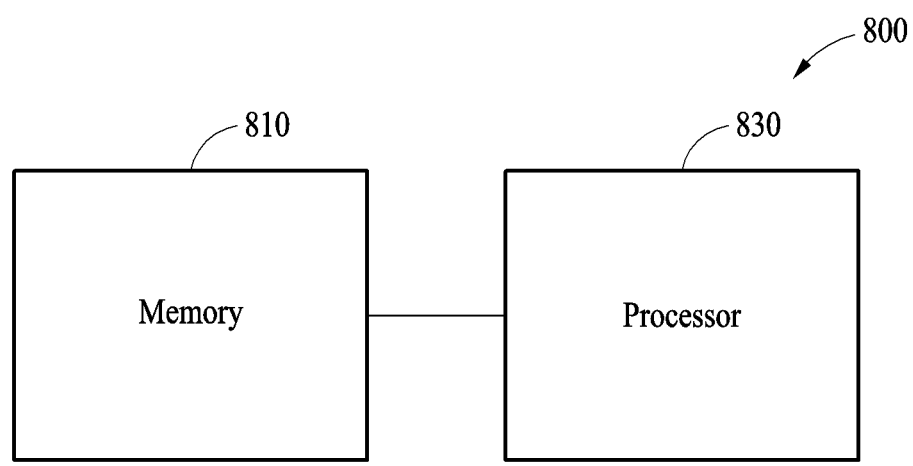
FIG. 8 illustrates another example of the operating appliance identification device according to an example embodiment.

The recorded individual appliance analysis information table 110 may be stored in a memory (e.g., the memory 810 of FIG. 8).

Figure 4:
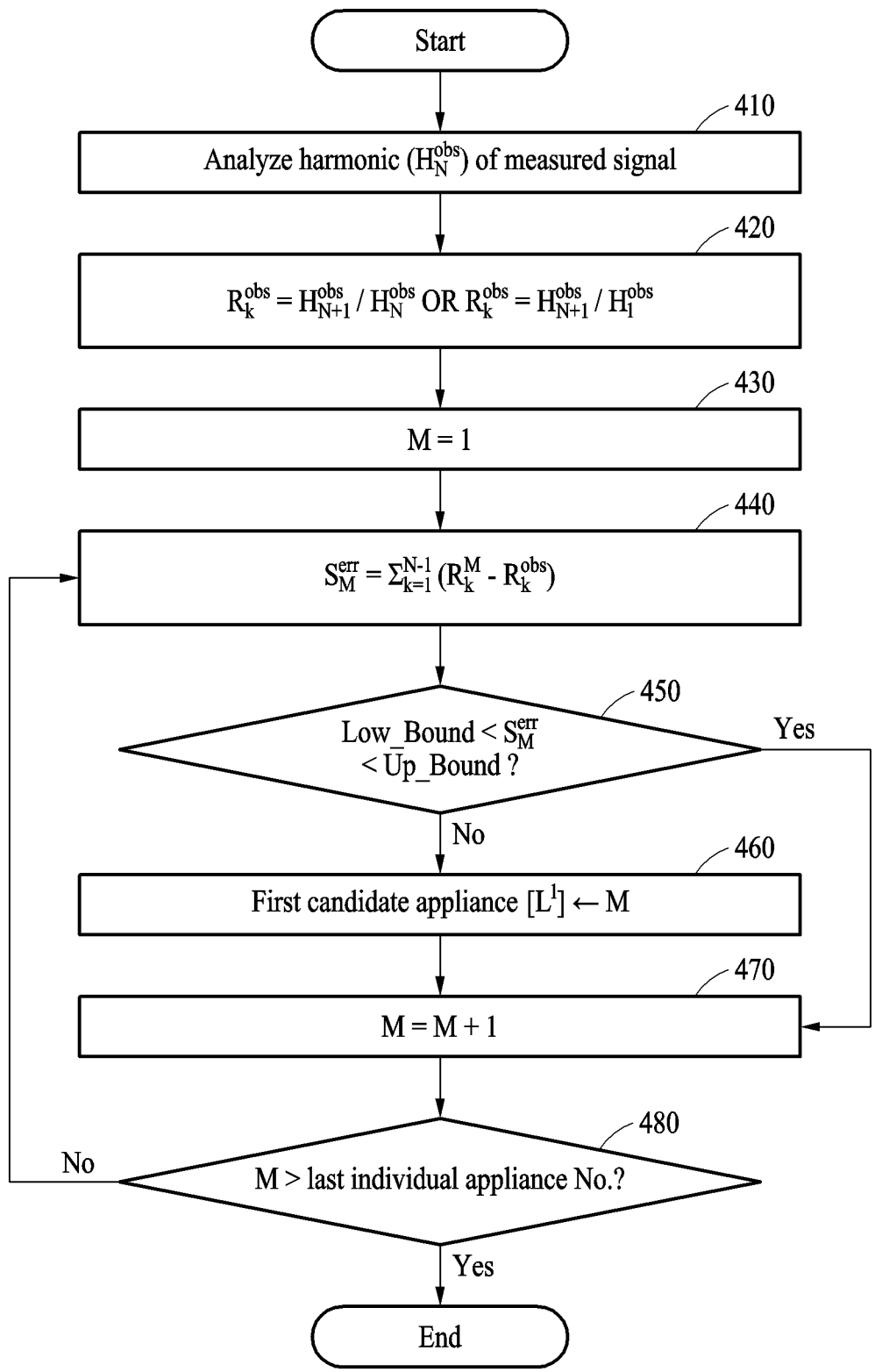
FIG. 4 is an example of a flowchart illustrating an example of an operation of generating a first candidate appliance list by an operating appliance identification device.

FIG. 4 is an example of a flowchart for illustrating an example of an operation of generating a first candidate appliance list by the operating appliance identification device.

The first candidate appliance list generator 120 may generate the first candidate appliance list.

In operation 410, the first candidate appliance list generator 120 may extract the Nth-order (e.g., N is an integer of 1 or more, odd, or even) harmonic component value ($H_N^{obs}$) (e.g., N is the order of harmonic) through signal processing (e.g., fast fourier transform (FFT)) of the collected mixed load signal.

In operation 420, the first candidate appliance list generator 120 may calculate the ratio ($R_k^{obs}$) of the harmonic component value included in the mixed load signal by using the extracted harmonic component value ($H_N^{obs}$). The ratio ($R_k^{obs}$) of the harmonic component value included in the mixed load signal may be a ratio ($H_{N+1}^{obs}/H_N^{obs}$) of adjacent harmonic component values or a ratio ($H_{N+1}^{obs}/H_1^{obs}$) of the first-order harmonic component value and the (N+1)th-order harmonic component value (e.g., N is an integer of 1 or more, odd, or even). The ratio ($R_k^{obs}$) of the harmonic component value included in the mixed load signal may be calculated using Equation (2).

$$R_k^{obs} = H_{N+1}^{obs}/H_N^{obs} \text{ OR } R_k^{obs} = H_{N+1}^{obs}/H_1^{obs} \qquad \text{[Equation 2]}$$

In operation 430, the first candidate appliance list generator 120 may select one appliance from the individual appliance harmonic component analysis table 110.

In operation 440, the first candidate appliance list generator 120 may calculate an error of the ratio ($R_k^M$) of the harmonic component value included in the individual appliance signal of the selected appliance (e.g., M is the selected appliance sequence number) and the ratio ($R_k^{obs}$) of the harmonic component value included in the mixed load signal for each order, and sum the errors. The sum of the errors ($S_M^{err}$) may be calculated using Equation (3).

$$S_M^{err} = \Sigma_{k=1}^{N-1}(R_k^M - R_k^{obs}) \qquad \text{[Equation 3]}$$

In operation 450, the first candidate appliance list generator 120 may calculate whether the sum of the errors ($S_M^{err}$) is included in a range of a predetermined threshold value. For example, the first candidate appliance list generator 120 may calculate whether the sum of the errors ($S_M^{err}$) is greater than lower limit of the predetermined threshold. The first candidate appliance list generator 120 may calculate whether the sum of the errors ($S_M^{err}$) is less than upper limit of the predetermined threshold. The threshold value may be freely predetermined by a user or a supplier of the operating appliance identification device 100.

In operation 460, the first candidate appliance list generator 120 may include the selected appliance in the first candidate appliance list when the sum of the errors ($S_M^{err}$) is within a predetermined threshold range. The degree of similarity between the individual appliance signal and the mixed load signal may be identified through the sum of errors ($S_M^{err}$). The larger the sum of errors ($S_M^{err}$), the more different the composition of harmonic components of the individual appliance signal and the mixed load signal, and the smaller the sum of errors ($S_M^{err}$), the more similar the composition of the harmonic components of the individual appliance signal and the mixed load signal.

In operation 470, the first candidate appliance list generator 120 may select another appliance from the individual appliance harmonic component analysis table 110.

In operation 480, the first candidate appliance list generator 120 may finish the operation when there is no other appliance to select from the individual appliance harmonic component analysis information table 110. When there is another appliance to select from the individual appliance harmonic component analysis information table 110, the first candidate appliance list generator 120 may repeat operation 410 and operation 470 to generate a first candidate appliance list including the first candidate appliances.

Figure 5:
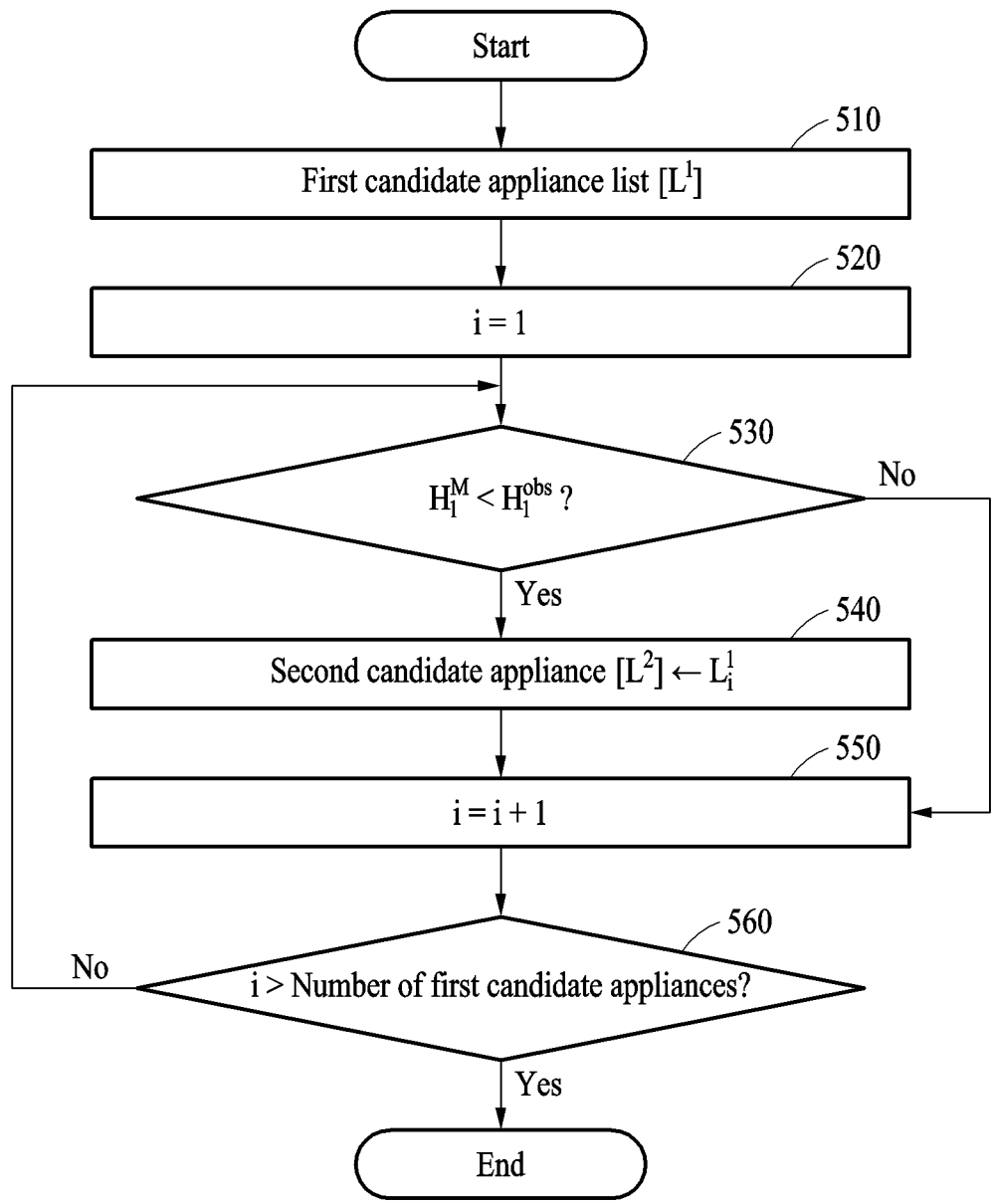
FIG. 5 is an example of a flow chart illustrating an example of an operation of generating a second candidate appliance list by an operating appliance identification device.

FIG. 5 is an example of a flow chart for illustrating an example of an operation of generating a second candidate appliance list by the operating appliance identification device.

The second candidate appliance list generator 130 may generate a second candidate appliance list.

In operation 510, the second candidate appliance list generator 130 may receive the first candidate appliance list ($L_i^1$).

In operation 520, the second candidate appliance list generator 130 may select one candidate appliance from the first candidate appliance list ($L_i^1$).

In operation 530, the second candidate appliance list generator 130 may compare the magnitude ($H_1^M$) of the first-order harmonic component value included in the individual appliance signal of the selected candidate appliance with the magnitude ($H_1^{obs}$) of the first-order harmonic component value included in the mixed load signal using Equation (4).

$$H_1^M < H_1^{obs} \qquad \text{[Equation 4]}$$

In operation 540, the second candidate appliance list generator 130 may include the selected candidate appliance in the second candidate appliance list when the magnitude ($H_1^M$) of the first-order harmonic component value included in the individual appliance signal of the selected candidate appliance is lower than the magnitude ($H_1^{obs}$) of the first-order harmonic component value included in the mixed load signal.

In operation 550, the second candidate appliance list generator 130 may select another candidate appliance from the first candidate appliance list ($L_i^1$).

In operation 560, the second candidate appliance list generator 130 may finish the operation when there is no other candidate appliance to select from the first candidate appliance list ($L_i^1$). The second candidate appliance list generator 130 may repeat the operation 520 to the operation 550 when there is another candidate appliance to select from the first candidate appliance list ($L_i^1$) to generate a second candidate appliance list ($L^2$) including second candidate appliances.

Figure 6:
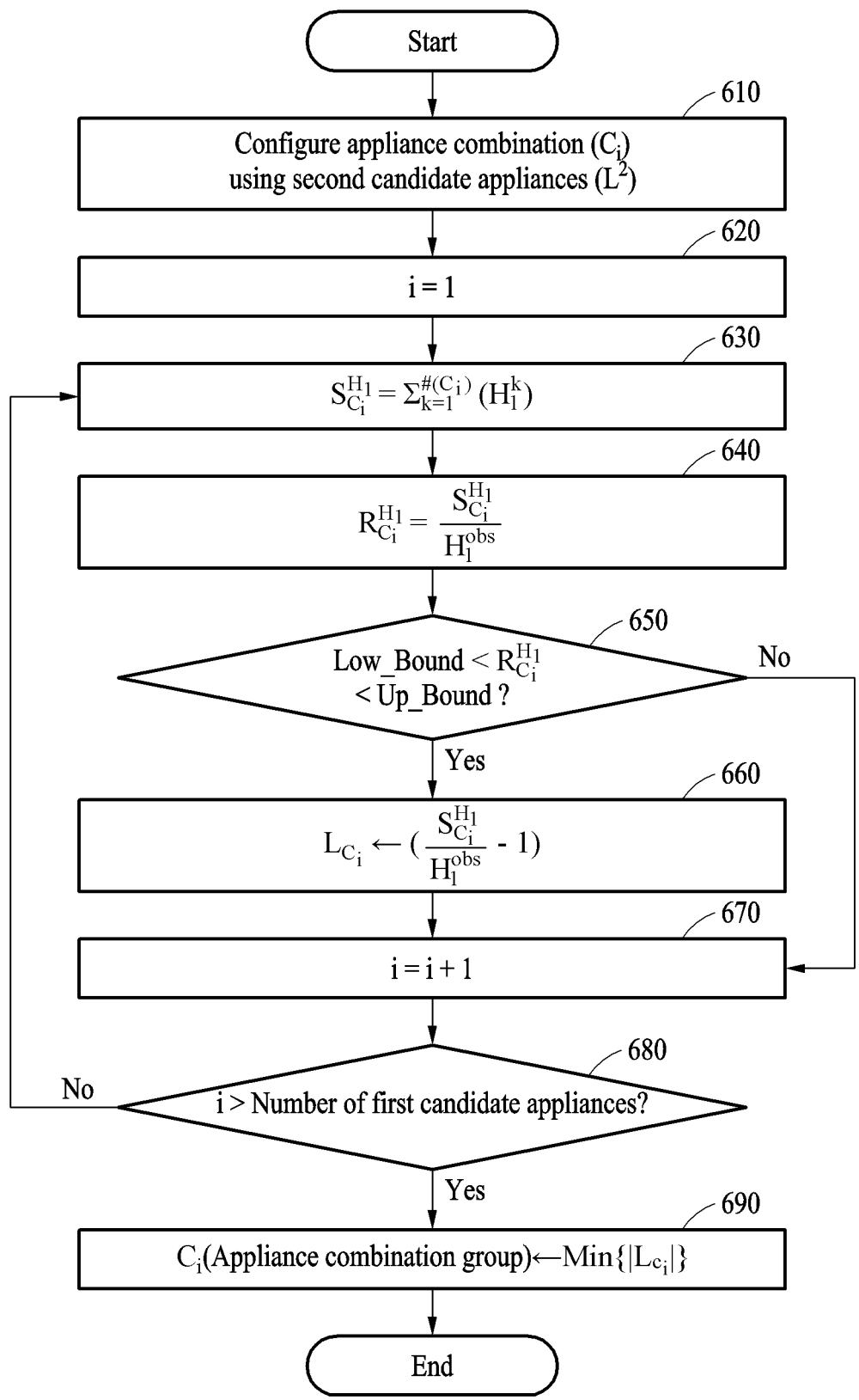
FIG. 6 is an example of a flow chart illustrating an example of an operation of identifying an operating appliance by an operating appliance identification device.

FIG. 6 is an example of a flow chart for illustrating an example of an operation of identifying the operating appliance by the operating appliance identification device.

The operating appliance identifier 140 may identify the operating appliance.

In operation 610, the operating appliance identifier 140 may generate an appliance combination ($C_i$) that can be made with appliances in the second candidate appliance list ($L^2$).

In operation 620, the operating appliance identifier 140 may select one of the generated appliance combination ($C_i$).

In operation 630, the operating appliance identifier 140 may calculate the sum ($S_{C_i}^{H_1}$) of the magnitudes of the first-order harmonic component values included in the individual appliance signals of the appliances in the selected appliance combination ($C_i$). The sum ($S_{C_i}^{H_1}$) of the magnitudes of the first-order harmonic component values included in the individual appliance signals may be calculated using Equation (5).

$$S_{C_i}^{H_1} = \Sigma_{k=1}^{\#(C_1)} (H_1^k)$$ [Equation 5]

In operation 640, the operating appliance identifier 140 may calculate the ratio ($R_{C_i}^{H_1}$) of the sum ($S_{C_i}^{H_1}$) of the magnitude of the first-order harmonic component value included in the individual appliance signal and the magnitude ($H_1^{obs}$) of the first-order harmonic component value included in the mixed load signal. The ratio ($R_{C_i}^{H_1}$) of the magnitude of the first-order harmonic component value may be calculated using Equation (6).

$$R_{C_i}^{H_1} = \frac{S_{C_i}^{H_1}}{H_1^{obs}}$$ [Equation 6]

In operation 650, the operating appliance identifier 140 may calculate whether the ratio of the magnitude of the first-order harmonic component value ($R_{C_i}^{H_1}$) is included in the range of the predetermined threshold value. The operating appliance identifier 140 may calculate whether the ratio of the magnitude of the first-order harmonic component value ($R_{C_i}^{H_1}$) is greater than lower limit of the predetermined threshold. The operating appliance identifier 140 may calculate whether the ratio of the magnitude of the first-order harmonic component value ($R_{C_i}^{H_1}$) is lower than the upper limit of the predetermined threshold value. The threshold value may be freely predetermined by a user or a supplier of the operating appliance identification device 100.

In operation 660, the operating appliance identifier 140 may store the selected appliance combination ($C_i$) in the candidate appliance combination list ($L_{C_i}$) when the ratio ($R_{C_i}^{H_1}$) of the magnitude of the first-order harmonic component value is within the range of a predetermined threshold value. The operating appliance identifier 140 may store the value $$\left( \frac{S_{C_i}^{H_1}}{H_1^{obs}} - 1 \right)$$

obtained by subtracting 1 from the ratio ($R_{C_i}^{H_1}$) of the magnitude of the first-order harmonic component value in the candidate appliance combination list ($L_{C_i}$) when the ratio ($R_{C_i}^{H_1}$) of the magnitude of the first-order harmonic component value is within the predetermined threshold value.

In operation 670, the operating appliance identifier 140 may select another one of the appliance combinations ($C_i$).

In operation 680, the operating appliance identifier 140 may finish the operation when there is no other appliance combination ($C_i$) to select. When there is another appliance combination ($C_i$) to select, the operating appliance identifier 140 may generate a candidate appliance combination list ($L_{C_i}$) including the appliance combinations ($C_i$) by repeating the operation 630 to the operation 670 described above.

In operation 690, the operating appliance identifier 140 may select the appliance combination ($C_i$) in which a value $$\left( \frac{S_{C_i}^{H_1}}{H_1^{obs}} - 1 \right)$$

obtained by subtracting 1 from the ratio of the magnitude of the first-order harmonic component value is closest to 0 among the appliance combinations ($C_i$) included in the candidate appliance combination list ($L_{C_i}$), and may determine the appliance included in the selected appliance combination ($C_i$) as an operating appliance.

FIG. 7A to FIG. 7E are examples of performing the operating appliance identification method by the operating appliance identification device.

For convenience of explanation, it is assumed that individual appliances connected to the power distribution network 30 are a total of 8 appliances such as (1) a microwave oven, (2) a toaster, (3) an electric pot, (4) a dryer, (5) a kimchi refrigerator, (6) a fan, (7) a LED light, and (8) a laptop computer. A mixed load signal may be generated by sampling a current signal measured by a clamp-type ammeter at a rate of 600 ksps. Of the 8 appliances, (1) the microwave oven, (2) the toaster, and (3) the electric pot may be used simultaneously to collect mixed load signals.

Referring to FIG. 7A, the operating appliance identification device 100 may prepare in advance the individual appliance harmonic analysis information table 110 shown in FIG. 7A. The harmonic component values included in the individual appliance signals of the appliances (1) to (8) may be stored in the table in advance. Referring to FIG. 7A, the odd (e.g., 1st, 3rd, 5th, 7th, 9th, 11th) harmonic component values included in the individual appliance signals may be stored in the individual appliance harmonic analysis information table 110. The harmonic component value included in the mixed load signal of the last column of the table shown in FIG. 7A may be reflected after generating the first candidate appliance list.

Referring to FIG. 7B, the ratio of the harmonic component value stored in the harmonic analysis information table 110 is shown in FIG. 7B. The ratio of the harmonic component value may be a ratio of adjacent harmonic component values. For example, the H3/H1 value of the microwave oven may be about 0.26718. It may be identified that the third harmonic (H3) component value of the microwave oven is about 26.7% of the first-order harmonic (H1) component value.

Referring to FIG. 7C, the error between the ratio of the harmonic component value included in the individual appliance signal and the ratio of the harmonic component value included in the mixed load signal and the sum of the errors may be described in FIG. 7C, and the error is obtained through generating first candidate appliance list by the operating appliance identification device 100. In this case, the lower limit of the threshold value may be predetermined to −1.05 and the upper limit of the threshold value may be predetermined to 1.05. (1) The microwave oven, (2) the toaster, (3) the electric pot, and (5) the kimchi refrigerator which are within the threshold range may be selected as first candidate appliances. The number of candidate appliances may be reduced from 8 to 4 through generating the first candidate appliance list.

Referring to FIG. 7D, the magnitude of the first-order harmonic component value included in the individual appliance signal and magnitude relationship between the first-order harmonic component value included in the individual appliance signal and the first-order harmonic component value included in the mixed load signal may be described in FIG. 7D, and the magnitude and the magnitude relationship is obtained by the operating appliance identification device 100 through generating the second candidate appliance list. (1) The microwave oven, (2) the toaster, (3) the electric pot, and (5) the kimchi refrigerator that the first-order harmonic component value included in the individual appliance signal is less than the first-order harmonic component value included in the mixed load signal may be selected as second candidate appliance. Even after the second candidate appliance list is generated, the number of candidate appliances may still be four.

Referring to FIG. 7E, information related to the appliance combination obtained by the operating appliance identification device 100 through identifying the operating appliance may be described in FIG. 7E. In the first column of the table shown in FIG. 7E, all appliance combinations that can be made with four candidate appliances (e.g. (1) the microwave oven, (2) the toaster, (3) the electric pot, and (5) the kimchi refrigerator) may be shown. In the second column of the table, the sum of the magnitudes of the first-order harmonic components included in the individual appliance signals of the four candidate appliances may be shown. In the third column of the table, the sum of the magnitudes of the first-order harmonic components included in the individual appliance signals of the four candidate appliances and the ratio of the first-order harmonic components included in the mixed load signal may be shown. The lower limit of the threshold value may be predetermined to 1.00 and the upper limit of the threshold value may be predetermined to 1.10. The appliance combination within the range of the threshold value may be a combination of (1) the microwave oven, (2) the toaster, and (3) the electric pot. (1) The microwave oven, (2) the toaster, and (3) the electric pot may be determined as operating appliances.

FIG. 8 illustrates another example of the operating appliance identification device according to an example embodiment.

The operating appliance identification device 800 may be substantially the same as the operating appliance identification device 100 of FIG. 1. The operating appliance identification device 800 may include a memory 810 and a processor (830).

The memory 810 may store instructions (e.g., a program) executable by the processor 830. For example, the instructions may include instructions for executing an operation of the processor 830 and/or an operation of each component of the processor 830.

The processor 830 may process data stored in the memory 810. The processor 830 may execute computer readable code (e.g., software) stored in the memory 810 and instructions induced by the processor 830.

The processor 830 may be a a data processing device implemented as hardware having a circuit having a physical structure for executing desired operations. For example, desired operations may include code or instructions included in a program.

For example, the data processing device implemented as hardware includes a microprocessor, a central processing unit, a processor core, a multi-core processor, and a multi-processor, an application-specific integrated circuit (ASIC), and a field programmable gate array (FPGA).

The operation performed by the processor 830 may be substantially the same as the operation of the operating appliance identification device 100 described with reference to FIG. 1 to FIG. 8. Each component of the operating appliance identification device 100 described in FIG. 1 to FIG. 8 (e.g., individual appliance harmonic analysis information table 110, the first candidate appliance list generator 120, the second candidate appliance list generator 130, and the operating appliance identifier 140) may be executed by the processor 830. Accordingly, detailed description is omitted.

The components described in the example embodiments may be implemented by hardware components including, for example, at least one digital signal processor (DSP), a processor, a controller, an application-specific integrated circuit (ASIC), a programmable logic element, such as a field programmable gate array (FPGA), other electronic devices, or combinations thereof. At least some of the functions or the processes described in the example embodiments may be implemented by software, and the software may be recorded on a recording medium. The components, the functions, and the processes described in the example embodiments may be implemented by a combination of hardware and software.

The example embodiments described herein may be implemented using hardware components, software components, or a combination thereof. A processing device may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such as parallel processors.

The software may include a computer program, a piece of code, an instruction, or some combination thereof, to independently or collectively instruct or configure the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. The software and data may be stored by one or more non-transitory computer readable recording mediums.

The method according to the above-described example embodiments may be recorded in non-transitory computer-readable media including program instructions to implement various operations which may be performed by a computer. The media may also include, alone or in combination with the program instructions, data files, data structures, and the like. The program instructions recorded on the media may be those specially designed and constructed for the purposes of the example embodiments, or they may be of the well-known kind and available to those having skill in the computer software arts. Examples of non-transitory computer-readable media include magnetic media such as hard disks, floppy disks, and magnetic tape; optical media such as CD ROM discs and DVDs; magneto-optical media such as optical discs; and hardware devices that are specially configured to store and perform program instructions, such as read-only memory (ROM), random access memory (RAM), flash memory, and the like. Examples of program instructions include both machine code, such as code produced by a compiler, and files containing higher level code that may be executed by the computer using an interpreter.

The described hardware devices may be configured to act as one or more software modules in order to perform the operations of the above-described example embodiments, or vice versa.

While the example embodiments have been described with reference to the limited drawings as described above, it will be apparent to one of ordinary skill in the art that various changes and modifications in form and details may be made in these example embodiments without departing from the spirit and scope of the claims and their equivalents. Suitable results may be achieved if the described techniques are performed in a different order, and/or if components in a described system, architecture, device, or circuit are combined in a different manner and/or replaced or supplemented by other components or their equivalents.

Therefore, other implementations, other example embodiments, and equivalents to the claims are also within the scope of the appended claims.

What is claimed is:

1. An operating appliance identification method comprising:
   collecting a mixed load signal from a home power distribution network by an operating appliance identification device including memory and an associated processor, the operating appliance identification device connected to the home power distribution network to which a plurality of appliances are connected;
   generating, by the associated processor, a first candidate appliance list by selecting first candidate appliances among individual appliances registered in an individual appliance harmonic analysis information table based on a ratio of a harmonic component value included in the mixed load signal;
   generating, by the associated processor, a second candidate appliance list including second candidate appliances by filtering the first candidate appliances based on a magnitude of the harmonic component value included in the mixed load signal; and
   identifying, by the associated processor, an operating appliance among the plurality of appliances connected to the home power distribution network by using the second candidate appliance list,
   wherein the identifying of the operating appliance comprises:
      generating appliance combinations capable of being made with appliances in the first candidate appliance list;
      selecting one of the appliance combinations;
      calculating a sum of magnitudes of first-order harmonic component values included in individual appliance signals of appliances in the selected appliance combination; and
      calculating a ratio of the sum of the magnitudes of the first-order harmonic component values included in the individual appliance signals and a magnitude of a first-order harmonic value of the mixed load signal.

2. The operating appliance identification method of claim 1, further comprising:
   generating, by the associated processor, the individual appliance harmonic analysis information table.

3. The operating appliance identification method of claim 2, wherein the generating of the individual appliance harmonic analysis information table comprises:
   selecting an individual appliance connected to a power distribution network;
   extracting a harmonic component value included in an individual appliance signal generated when the selected individual appliance operates;
   calculating a ratio of the harmonic component value based on the harmonic component value included in the individual appliance signal; and
   storing, in the memory, the ratio of the harmonic component value included in the individual appliance signal.

4. The operating appliance identification method of claim 3, wherein
   the ratio of the harmonic component value included in the individual appliance signal is a ratio of adjacent harmonic component values or a ratio of a first-order harmonic component value and an (N+1)th-order harmonic component value, and
   the N is an integer of 1 or more.

5. The operating appliance identification method of claim 1, wherein
   the ratio of the harmonic component value included in the mixed load signal is a ratio of adjacent harmonic component values or a ratio of a first-order harmonic component value and an (N+1)th-order harmonic component value, and
   the N is an integer of 1 or more.

6. The operating appliance identification method of claim 1, wherein the generating of the first candidate appliance list comprises:
   extracting the harmonic component value included in the mixed load signal; and
   calculating the ratio of the harmonic component value based on a plurality of harmonic component values.

7. The operating appliance identification method of claim 6, wherein the generating of the first candidate appliance list comprises:
   selecting an appliance from the individual appliance harmonic component analysis table;
   calculating an error between a ratio of a harmonic component value included in an individual appliance signal of the selected appliance and the ratio of the harmonic component value included in the mixed load signal for each of the first-order and the (N+1)th-order;
   summing up the errors obtained for each of the first-order and the (N+1)th-order; and including the selected appliance in the first candidate appliance list based on the sum of the errors.

8. The operating appliance identification method of claim 1, wherein the generating of the second candidate appliance list comprises:
selecting a candidate appliance from the first candidate appliance list; and
including the selected candidate appliance in the second candidate appliance list by comparing a magnitude of a first-order harmonic component value included in an individual appliance signal of the selected candidate appliance with a magnitude of a first-order harmonic component value included in the mixed load signal.

9. The operating appliance identification method of claim 1, wherein the identifying of the operating appliance further comprises:
when the ratio of the magnitudes of the first-order harmonic component values is within a predetermined threshold range, recording the appliance combination and the ratio of the magnitudes of the first-order harmonic component values in a candidate appliance combination list;
selecting, among appliance combinations included in the candidate appliance combination list, an appliance combination in which a value obtained by subtracting 1 from the ratio of the magnitudes of the first-order harmonic component values is closest to 0; and
determining appliances included in the selected appliance combination as operating appliances.

10. An operating appliance identification device comprising:
a memory configured to store one or more instructions; and
a processor configured to execute the one or more instructions,
wherein, when the one or more instructions are executed, the processor is configured to:
collect a mixed load signal from a home power distribution network, the operating appliance identification device connected to the home power distribution network to which a plurality of appliances are connected;
generate a first candidate appliance list by selecting first candidate appliances among individual appliances registered in an individual appliance harmonic analysis information table based on a ratio of a harmonic component value included in the mixed load signal;
generate a second candidate appliance list including second candidate appliances by filtering the first candidate appliances based on a magnitude of the harmonic component value included in the mixed load signal; and
identify an operating appliance among the plurality of appliances connected to the home power distribution network by using the second candidate appliance list
wherein in the identifying of the operating appliance, the processor is configured to:
generate appliance combinations capable of being made with appliances in the first candidate appliance list;
select one of the appliance combinations;
calculate a sum of magnitudes of first-order harmonic component values included in individual appliance signals of appliances in the selected appliance combination; and
calculate a ratio of the sum of the magnitudes of the first-order harmonic component values included in the individual appliance signals and a magnitude of a first-order harmonic value of the mixed load signal.

11. The operating appliance identification device of claim 10, wherein the processor is configured to generate the individual appliance harmonic analysis information table.

12. The operating appliance identification device of claim 11, wherein the processor is configured to:
select an appliance connected to a power distribution network;
extract a harmonic component value included in an individual appliance signal generated when the selected appliance operates;
calculate a ratio of the harmonic component value based on the harmonic component value included in the individual appliance signal; and
store, in the memory, the ratio of the harmonic component value of the selected appliance.

13. The operating appliance identification device of claim 12, wherein
the ratio of the harmonic component value included in the individual appliance signal is a ratio of adjacent harmonic component values or a ratio of a first-order harmonic component value and an (N+1)th-order harmonic component value, and
the N is an integer of 1 or more.

14. The operating appliance identification device of claim 10, wherein
the ratio of the harmonic component value included in the mixed load signal is a ratio of adjacent harmonic component values or a ratio of a first-order harmonic component value and an (N+1)th-order harmonic component value, and
the N is an integer of 1 or more.

15. The operating appliance identification device of claim 10, wherein the processor is configured to:
extract the harmonic component value included in the mixed load signal; and
calculate the ratio of the harmonic component value based on the harmonic component value.

16. The operating appliance identification device of claim 15, wherein the processor is configured to:
select an appliance from the individual appliance harmonic component analysis table;
calculate an error of a ratio of a harmonic component value included in an individual appliance signal of the selected appliance and the ratio of the harmonic component value included in the mixed load signal for each of the first-order and the (N+1)th-order;
sum up the errors obtained for each of the first-order and the (N+1)th-order; and
include the selected appliance in the first candidate appliance list based on the sum of the errors.

17. The operating appliance identification device of claim 10, wherein the processor is configured to:
select a candidate appliance from the first candidate appliance list; and
include the selected candidate appliance in the second candidate appliance list by comparing a magnitude of a first-order harmonic component value included in an individual appliance signal of the selected candidate appliance with a magnitude of a first-order harmonic component value included in the mixed load signal.

18. An operating appliance identification system, comprising:
a plurality of appliances connected to a home power distribution network; and
an operating appliance identification device configured to identify an operating appliance among the plurality of appliances, the operating appliance identification device including memory and an associated processor, wherein the operating appliance identification device is configured to:
  generate, by the associated processor, a first candidate appliance list by selecting first candidate appliances among individual appliances registered in an individual appliance harmonic analysis information table based on a ratio of a harmonic component value included in a mixed load signal;
  generate, by the associated processor, a second candidate appliance list including second candidate appliances by filtering the first candidate appliances based on a magnitude of the harmonic component value of the mixed load signal; and
  identify, by the associated processor, an operating appliance among the plurality of appliances by using the second candidate appliance list, and
wherein in the identifying of the operating appliance, the processor is configured to:
  generate appliance combinations capable of being made with appliances in the first candidate appliance list;
  select one of the appliance combinations;
  calculate a sum of magnitudes of first-order harmonic component values included in individual appliance signals of appliances in the selected appliance combination; and
  calculate a ratio of the sum of the magnitudes of the first-order harmonic component values included in the individual appliance signals and a magnitude of a first-order harmonic value of the mixed load signal.

* * * * *